United States Patent [19]
Olson et al.

[11] Patent Number: 5,587,883
[45] Date of Patent: Dec. 24, 1996

[54] LEAD FRAME ASSEMBLY FOR SURFACE MOUNT INTEGRATED CIRCUIT POWER PACKAGE

[75] Inventors: Timothy L. Olson, Phoenix; Lauriann T. Carney, Gilbert; Gary C. Johnson, Tempe; William M. Strom, Chandler, all of Ariz.

[73] Assignee: Motorola, Inc., Schaumburg, Ill.

[21] Appl. No.: 557,667

[22] Filed: Nov. 13, 1995

Related U.S. Application Data

[63] Continuation of Ser. No. 376,636, Jan. 23, 1995, abandoned, which is a continuation of Ser. No. 215,000, Mar. 18, 1994, abandoned, which is a continuation of Ser. No. 985,055, Dec. 3, 1992, abandoned.

[51] Int. Cl.⁶ ..................... H05K 7/20
[52] U.S. Cl. ............ 361/723; 174/52.2; 257/675; 361/813; 437/211
[58] Field of Search ............... 361/704–707, 361/709, 710, 712, 723, 813; 174/16.3, 52.2; 165/80.3, 185; 437/209, 211, 220; 257/706, 707, 714, 664, 666, 670, 672, 675

[56] References Cited

U.S. PATENT DOCUMENTS

| | | | |
|---|---|---|---|
| 3,922,712 | 11/1975 | Stryker | 357/81 |
| 3,930,114 | 12/1975 | Hodge | 174/16.3 |
| 4,158,745 | 6/1979 | Keller | 174/52 FP |
| 4,480,262 | 10/1984 | Butt | 357/74 |
| 4,807,018 | 2/1989 | Cellai | 357/70 |
| 4,849,857 | 7/1989 | Butt | 361/388 |
| 4,916,506 | 4/1990 | Gagnon | 357/70 |
| 4,916,518 | 4/1990 | Yoshimura | 357/70 |
| 4,920,074 | 4/1990 | Shimizu | 361/813 |
| 5,028,741 | 7/1991 | Sanders | 361/813 |
| 5,031,022 | 7/1991 | Yamamoto | 361/813 |
| 5,041,902 | 8/1991 | McShane | 357/79 |
| 5,049,973 | 9/1991 | Satriano | 357/70 |
| 5,210,440 | 5/1993 | Long | 257/675 |
| 5,338,971 | 8/1994 | Casati | 257/666 |
| 5,378,924 | 1/1995 | Liang | 257/675 |
| 5,420,758 | 5/1995 | Liang | 361/813 |
| 5,438,021 | 8/1995 | Tawaga | 437/207 |

*Primary Examiner*—Gerald P. Tolin
*Attorney, Agent, or Firm*—Michael D. Bingham; Gary W. Hoshizaki

[57] ABSTRACT

A lead frame package for housing an integrated circuit. A lead frame (11) having a plurality of leads (13) extending from at least three sides of the package. Lead frame (11) is formed having a first region (18), a transition region (19), and a second region (21). A distance between a heat sink (12) and the lead frame (11) may vary. The offset is chosen to compensate for a predetermined distance between the heat sink (12) and the lead frame (11) such that the lead frame (11) aligns to lead frame handling equipment. A single lead frame manufacturing setup can then be used. A slot (22) is formed in the lead frame (11) extending through the second region (21) and the transition region (19) into first area (18) providing a path for injecting an encapsulation material into a mold.

9 Claims, 1 Drawing Sheet

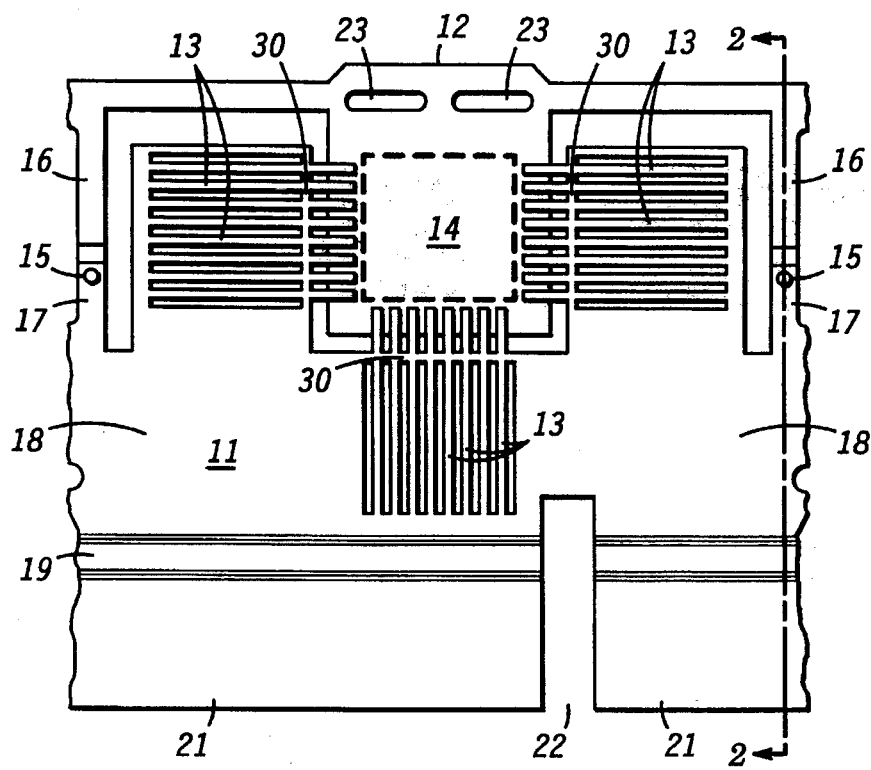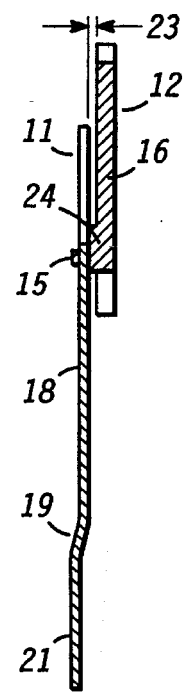
FIG. 1
FIG. 2
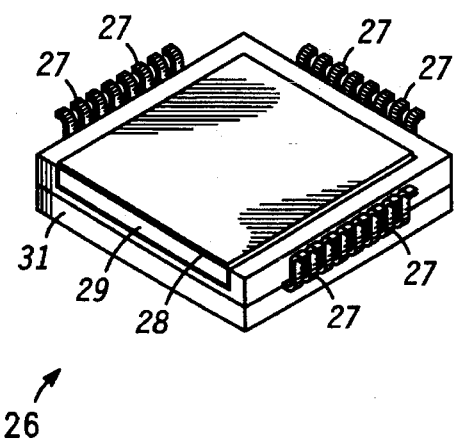
FIG. 3

LEAD FRAME ASSEMBLY FOR SURFACE MOUNT INTEGRATED CIRCUIT POWER PACKAGE

This application is a continuation of prior application Ser. No. 08/376,636, abandoned filed Jan. 23, 1995, which is a continuation of Ser. No. 08/215,000 filed Mar. 18, 1994 abandoned which is a continuation of Ser. No. 07/985,055 filed Dec. 3, 1992 abandoned.

BACKGROUND OF THE INVENTION

This invention relates, in general, to packages for integrated circuits, and more particularly to high power surface mount lead frame packages with high pin counts.

Wafer fabrication innovations continue to increase circuit density per unit area on a semiconductor die. Higher circuit density per unit area generally corresponds to an increase in power dissipation, also increased circuit functionality generates higher input/output (I/O) pin counts. Both increased heat dissipation and higher pin counts are critical parameters which must be accommodated when designing a semiconductor package.

There are a myriad of semiconductor packages currently offered which meet the many criteria necessary for a high power application but most are high cost due to the expense or complications of manufacturing and materials. For example, a ceramic leaded chip carrier is a very common, high power, high pin count package which would be prohibitively expensive to house a semiconductor chip where cost is a key imperative. On the other end of the power package spectrum are thru hole power packages which use lead frame construction. This type of package is used for low cost circuits such as a voltage regulator. The lead frame thru hole package are lead limited (typically less than 20) which severely reduces the types of circuit applications it may accommodate.

Lead frame packages are well known in the semiconductor industry as low cost, simple to manufacture semiconductor packages, however, power dissipation is typically limited to one watt or less. It would be of great benefit if a low cost package could be developed capable of dissipating more than one watt and having greater than 20 leads for external connection.

SUMMARY OF THE INVENTION

Briefly stated, this invention provides a lead frame having high pin counts for a semiconductor package. The lead frame has a plurality of leads which extend from at least three sides of the semiconductor package. The lead frame has a first region, a transition region, and a second region. The plurality of leads are contained in the first region of the lead frame. The second region aligns to lead frame handling equipment during the semiconductor package manufacturing process. The transition region is bent to form an offset between the plane of the first region and the plane of the second region. The offset provides height compensation to ensure the second region aligns to the lead frame handling equipment.

BRIEF DESCRIPTION OF THE DRAWINGS

FIG. 1 is an illustration of a lead frame and a heat sink in accordance with the present invention;

FIG. 2 is a cross-sectional view of the lead frame and the heat sink of FIG. 1 taken in the direction of arrow 2—2; and FIG. 3 is a view of a lead frame package in accordance with the present invention.

DETAILED DESCRIPTION OF THE DRAWINGS

FIG. 1 is an illustration of a lead frame and a heat sink in accordance with the present invention.

There is a large market for medium lead count packages (approximately 100 leads or less) capable of dissipating 2 to 30 watts. Power packages typically fail to meet specifications in one of the following categories: 1) lead count, 2) cost, or 3) complexity of manufacture. Although many different types of packages exist which meet lead count and power dissipation requirements most fail due to the complexity of manufacture or package cost.

Lead frame packages are well known in the semiconductor packaging art. Lead frame packages are typically used on inexpensive semiconductor components due to the low cost, ease of manufacture, and the high reliability of this form of package. Lead frame packages currently on the market do not meet both lead count and power dissipation figures. A critical factor in maintaining low cost in a new lead frame package design is compatibility with the existing manufacturing flow and equipment. These issues have been addressed and are resolved by this invention while maintaining the simplicity and low cost of the lead frame package manufacturing flow.

Illustrated in FIG. 1 is a lead frame 11 coupled to a heat sink 12 for forming a semiconductor package. In the preferred embodiment, lead frame 11 and heat sink 12 are formed of copper or copper alloy, other heat and electrically-conductive materials could also be used. Lead frame 11 has a plurality of lead members 13 for coupling to an integrated circuit. Lead frame 11 has lead members 13 formed in three groups of respective lead members with a middle group being orthogonal with respect to the other two groups which such that the lead members extend from at least three sides of the semiconductor package. Each individual lead of the lead members 13 are held in position with respect to each other by tie bars 30. Tie bars 30 are removed during the manufacturing process so that lead members 13 are electrically isolated from each other as is well known. Extending lead members 13 from three or more sides of the semiconductor package is an efficient way to increase lead or pin counts of a lead frame based package. Heat sink 12 is chosen to have sufficient mass and heat conductive properties for the specific application.

It should be obvious to those skilled in the art that both lead frame 11 and heat sink 12 can be formed in strips having multiple lead frames or multiple heat sinks. The purpose of forming lead frames or heat sinks in strips is to increase manufacturing efficiency which is a standard practice in building lead frame packages.

A first surface 14 of heat sink 12 is an area for mounting an integrated circuit. Plurality of leads 13 are suspended a predetermined distance above heat sink 12 and extend over heat sink 12. In the preferred embodiment, the predetermined distance is chosen to allow plurality of lead members 13 to flex but not permanently bend during a bonding process. The bonding process consists of coupling a wire from a portion of each lead member 13 extending over heat sink 12 to a corresponding contact pad of the integrated circuit (not shown) which would be mounted on first surface 14. A downward pressure is exerted on each lead member 13 during wire bonding which causes each lead to flex and contact surface 14. Once the pressure is released each lead returns to a position similar to its original position. The predetermined distance is a function of the material of lead frame 11, the thickness of lead frame 11, and the length of the lead members 13 extending over heat sink 12.

Previously, a support structure was placed under the portion of lead members 13 which extend over heat sink 12 to prevent lead members 13 from bending during a bonding process. From a manufacturing standpoint it would be difficult or extremely cumbersome to place a support structure underneath lead members 13 when lead count is high or when lead members 13 extend from three or four sides thus increasing fabrication cycle time. The methodology described above eliminates the need for the support structure and simplifies manufacturing thereby reducing fabrication cycle time.

There are several known methods for suspending lead frame 11 above heat sink 12 during the package fabrication process. The purpose for suspending the lead frame is to ensure lead frame 11 will be physically isolated from heat sink 12 after manufacture of the semiconductor package. A first method is to place an insulation material between lead frame 11 and heat sink 12. The thickness of the insulation material corresponds to the predetermined distance between lead frame 11 and heat sink 12. In the preferred embodiment, a mechanical method is used to suspend lead frame 11 above heat sink 12. Heat sink 12 has two arm like extensions 16 which correspond to two arm like extensions 17 of lead frame 11. A stud 15 on each arm 16 aligns to an opening on each arm 17 of lead frame 11. Each stud. 15 extends through a corresponding opening in each arm 17 and is staked to fasten lead frame 11 to heat sink 12. The predetermined distance between lead frame 11 and heat sink 12 can be created in several ways. First, the thickness of arm like extensions 16 can be made thicker (by the predetermined distance) than the thickness of heat sink material corresponding to area 14, when lead frame 11 is clamped to heat sink 12 it will be suspended over area 14 by the predetermined distance. Second, a portion of arm like extension 17 containing the opening can be deformed to create an offset equal to the predetermined distance. In other words, the openings are below the plane of the lead frame by the predetermined distance. Finally, a combination of both the first and second methods could be used to create the predetermined distance between lead frame 11 and heat sink 12. Arm like extensions 16 and 17 are removed in the fabrication process to eliminate any coupling between lead frame 11 and heat sink 12. Both the insulation material method and the mechanical method listed above serves as a means for suspending lead frame 11 above heat sink (12).

Standardization is critical in maintaining or reducing fabrication costs in high volume packages. Varying the distance between lead frame 11 and heat sink 12 for different products would introduce problems in the manufacturing flow. Machinery which handles lead frame 11 and heat sink 12 are preset for a specific offset. Changing the distance (or offset) between lead frame 11 and heat sink 12 would also force the machinery to be adjusted each time a new offset was introduced. Machine down time to make the adjustments would only increase costs, thus it is critical to ensure that any new offsets within the package can be compensated for such that the machinery does not need to be adjusted.

Lead frame 11 can be broken into three distinct regions. A first region 18, a transition region 19, and a second region 21. In the preferred embodiment, first region 18 contains plurality of leads 13 and arm extensions 17. Second region 21 couples to lead frame handling equipment. Transition region 19 ensures alignment to lead frame handling equipment by adding an offset to second region 21. For this example, the predetermined distance between lead frame 11 and heat sink 12 was reduced from a standard distance to allow plurality of lead members 13 to flex and touch heat sink 12 (but not bend) during a bonding process. An offset in lead frame 11 must be introduced if lead frame 11 is to align to lead frame handling equipment which is set up for the standard distance used between lead frame 11 and heat sink 12. Transition region 19 is bent to form an offset between the planes of first region 18 and second region 21. The offset provides compensation to align second region 21 for coupling to lead frame handling equipment. In the preferred embodiment, the planes of first region 18 and second region 21 are parallel. Preforming lead frame 11 with the offset allows a standard manufacturing setup to be used independent of the distance between lead frame 11 and heat sink 12.

The offset in lead frame 11 does create an additional problem. The problem occurs in the molding process. An encapsulation material (such as plastic) is injected into a mold which encloses portions of lead frame 11 and heat sink 12. In a standard lead frame fabrication flow, lead frame 11 is planar and the encapsulation material is injected into the mold parallel to the planar surface, in fact a portion of the lead frame surface is used as a barrier for the injection path into the mold. This injection path crosses second region 21 and transition region 19 into first region 18 which is no longer on a single plane. A slot 22 resolves this issue and allows the standard lead frame fabrication flow to be used. Slot 22 extends through second region 21, transition region 19, and into first region 18. Slot 22 creates a path to first region 18 without interference from transition region 19 and second region 21.

A plurality of openings 23 are formed in heat sink 12 to simplify removing of heat sink material. Plurality of openings 23 (or cutaways) are positioned in a boundary path of the material to be removed. Only the material between plurality of openings 23 must be sheared or cut to remove portions of heat sink 12 thereby reducing effort required for trimming.

FIG. 2 is a cross-sectional view of the lead frame coupled to the heat sink of FIG. 1.

Lead frame 11 is suspended a predetermined distance above heat sink 12 as indicated by arrows 23. The suspension method as described in FIG. 1 has arm like extension 16 having a raised area 24. Raised area 24 is the predetermined distance above the surface of heat sink 12. Stud 15 on raised area 24 of arm like extension 16 passes through a corresponding opening of lead frame 11. Stud 15 is staked to hold lead frame 11 to the raised area suspending lead frame 11 the predetermined distance above heat sink 12.

Second region 21 is offset from first region 18 to align to lead frame handling equipment. Transition region 19 is bent to generate the offset. The plane of second region 21 is parallel to the plane of first region 18.

FIG. 3 is a view of an assembled lead frame package in accordance with the present invention.

A bottom view of a surface mount lead frame package 26 illustrates a plurality of leads 27 (corresponding to lead members 13 of lead frame 11) extending from three sides of package 26. Plurality of leads 27 are bent for Coupling to a surface (the surface is external to package 26). In the preferred embodiment, a portion of each lead used to contact the surface is on the same plane as a thermally or heat conductive material 28 placed on a second surface of heat sink 29. Thermally conductive material 28 also provides a means for attaching package 26 to a surface external to package 26. In the preferred embodiment, thermally conductive material is solder (tin/lead combination). The solder is used to bond or fasten to the external surface. An encapsulation material 31 protects an integrated circuit inside surface mount lead frame package 26. Encapsulation material 31 also bonds to heat sink 29 and plurality of leads 27 (or lead frame ) holding package 26 together.

By now it should be appreciated that a high lead count lead frame package for high power applications has been described. The lead frame package increases lead count, has an integral heat sink with a solderable surface, follows a standard lead frame manufacturing flow, and is low cost.

We claim:

1. A lead frame and heat sink assembly comprising:

the heat sink including:
   an area centrally located on a surface of said heat sink for mounting an integrated circuit; and the lead frame including:
   a first region in a first plane including a plurality of separated lead members;
   a transition region contiguous with said first region;
   a second region in a second plane contiguous with said transition region for coupling to lead frame handling equipment wherein an offset between said first and second region compensates for a reduction in spacing between the heat sink and the lead frame, wherein the lead frame and the heat sink are coupled together, and wherein said heat sink includes at least one raised area, said at least one raised area spacing said first region of said lead frame from said surface of said heat sink the predetermined distance from one another.

2. The lead frame and heat sink assembly as recited in claim 1 wherein a slot extends through said second region and said transition region into said first region.

3. The lead frame and heat sink assembly as recited in claim 2 wherein said heat sink includes a pair of arm like extensions each having a raised area and a stud formed thereon and wherein said lead frame includes a pair of arm extensions corresponding to said arm like extensions of said heat sink, said pair of arm extensions each having an opening formed therein receiving said studs.

4. The lead frame and heat sink assembly as recited in claim 3 wherein each stud is staked for holding said lead frame to each raised area of said heat sink thereby coupling said heat sink to said lead frame.

5. The lead frame and heat sink assembly as recited in claim 4 wherein a heat conductive material is placed on a back surface of said heat sink.

6. The lead frame and heat sink assembly as recited in claim 5 wherein said heat conductive material is solder.

7. A lead frame assembly for use in a semiconductor package comprising:

a lead frame comprising:
   a first region in a first plane including a plurality of separated lead members;
   a transition region contiguous with said first region;
   a second region in a second plane contiguous with said transition region wherein said first and second planes are separated by a predetermined distance, said transition region creating said predetermined distance between said first and second regions of the lead frame, wherein a slot extends through said second region and said transition region into said first region;

a heat sink having a first surface and a second surface, said first surface providing an area for centrally mounting a semiconductor die wherein said heat sink includes a pair of arm like extensions each having a raised area and a stud formed thereon and wherein said lead frame includes a pair of arm extensions corresponding to said arm like extensions of said heat sink, said pair of arm extensions each having an opening formed therein receiving said studs, said studs being staked for holding said lead frame to said heat sink.

8. The lead frame assembly as recited in claim 7 wherein a conductive material is placed on said second surface of said heat sink.

9. The lead frame assembly as recited in claim 7 wherein said raised area of said arm like extensions of said heat sink space said lead frame a predetermined distance from said heat sink, said predetermined distance allows said plurality of separated lead members to flex and contact said first surface of said heat sink when wire bonding thereto, said plurality of separated lead members returning to a substantially similar position after said wire bonding.

\* \* \* \* \*